United States Patent [19]
Tuthill

[11] Patent Number: 4,491,825
[45] Date of Patent: * Jan. 1, 1985

[54] HIGH RESOLUTION DIGITAL-TO-ANALOG CONVERTER

[75] Inventor: Michael G. Tuthill, Limerick, Ireland

[73] Assignee: Analog Devices, Incorporated, Norwood, Mass.

[*] Notice: The portion of the term of this patent subsequent to Jun. 6, 1999 has been disclaimed.

[21] Appl. No.: 363,144

[22] Filed: Mar. 29, 1982

Related U.S. Application Data

[63] Continuation-in-part of Ser. No. 272,053, Jun. 9, 1981, Pat. No. 4,338,591.

[51] Int. Cl.³ .............................. H03K 13/02
[52] U.S. Cl. .................. 340/347 DA; 340/340 CC; 340/340 M
[58] Field of Search .... 340/347 M, 347 DA, 347 CC; 364/718, 722, 851-853

[56] References Cited

U.S. PATENT DOCUMENTS 3,997,892 12/1976 Susset .................. 340/347 DA
4,338,591 7/1982 Tuthill .................. 340/347 DA

OTHER PUBLICATIONS

Gryzbowski et al., Nonlinear Functions from D/A Converters, Electronic Engineering, 7/1971, pp. 48-51.

*Primary Examiner*—T. J. Sloyan
*Attorney, Agent, or Firm*—Parmelee, Bollinger & Bramblett

[57] ABSTRACT

A digital-to-analog converter capable of high resolution performance, e.g. for converting 16-bit digital signals, comprising a cascaded two-stage device wherein the first stage consists of a segment converter with a series-connected string of resistors and switches operable by a set of high-order input bits for selecting the voltage across any one of the resistors, buffer amplifiers for directing the selected voltage to the input of a second-stage converter comprising a CMOS DAC with an R/2R ladder controlled by a set of lower order bits to interpolate between the limits of the selected voltage from the first stage, and wherein the switches for the first stage function to interchange the roles of the buffer amplifiers for each step up (or down) the resistor string so as to eliminate or minimize differential non-linearity errors due to offset mismatch between the buffer amplifiers.

3 Claims, 3 Drawing Figures

TRUTH TABLE FOR SWITCH DECODER

| DB15 | DB14 | DB13 | DB12 | SEGMENT SWITCHES |
|---|---|---|---|---|
| 1 | 1 | 1 | 1 | S15, S16 |
| 1 | 1 | 1 | 0 | S14, S15 |
| 1 | 1 | 0 | 1 | S13, S14 |
| 1 | 1 | 0 | 0 | S12, S13 |
| 1 | 0 | 1 | 1 | S11, S12 |
| 1 | 0 | 1 | 0 | S10, S11 |
| 1 | 0 | 0 | 1 | S9, S10 |
| 1 | 0 | 0 | 0 | S8, S9 |
| 0 | 1 | 1 | 1 | S7, S8 |
| 0 | 1 | 1 | 0 | S6, S7 |
| 0 | 1 | 0 | 1 | S5, S6 |
| 0 | 1 | 0 | 0 | S4, S5 |
| 0 | 0 | 1 | 1 | S3, S4 |
| 0 | 0 | 1 | 0 | S2, S3 |
| 0 | 0 | 0 | 1 | S1, S2 |
| 0 | 0 | 0 | 0 | S0, S1 |

HIGH RESOLUTION DIGITAL-TO-ANALOG CONVERTER

CROSS-REFERENCE TO RELATED APPLICATIONS

This application is a continuation-in-part of application Ser. No. 272,053, filed by the present applicant on June 9, 1981 U.S. Pat. No. 4,338,591.

BACKGROUND OF THE INVENTION

1. Field of the Invention

This invention relates to digital-to-analog converters (so-called DACs). More particularly, this invention relates to high-resolution converters, e.g. for converting 16-bit digital input signals into corresponding analog signals.

2. Description of the Prior Art

There has been a growing need in recent years for high-resolution digital-to-analog converters. The resolution of known types of monolithic converters employing R/2R ladder seems to have reached an apparent practical limit of about 12 bits. Thus it has become necessary to look for other solutions to the problem.

It has been recognized that in some applications, absolute accuracy in digital-to-analog converters is less important than good differential linearity and guaranteed monotonic behavior. Superior performance in such respects can be achieved by segment-type DACs comprising strings of series-connected resistors with switches to make connection to selected nodal points of the string.

Segment converters can be arranged in cascaded format, such that a first stage employing a resistor-string converter decodes a group of higher-order bits, and a second stage decodes the remaining, lower-order bits. A non-linear converter of that general type is shown in the article by Gryzbowski et al., "Non-linear Functions from D/A Converters", Electronic Engineering 1971, pp. 48–51. The converter disclosed in that article is designed for operation with relay switching, not modern semiconductor switching. U.S. Pat. No. 3,997,892 (Susset) shows a cascaded (non-linear) converter design intended for use with semiconductor switching. In this design, both the first and second stage comprise a resistor-string segment-type converter. The converter design includes buffer amplifiers to prevent the second-stage resistor string from loading the first-stage resistor string.

Although the prior art converters referred to above embody certain attractive aspects, they are not capable of the high-resolution performance now required in many applications. Thus it is an object of this invention to overcome the deficiencies of such prior art schemes.

SUMMARY OF THE INVENTION

In a preferred embodiment of the invention, to be described below in detail, there is provided a two-stage cascaded converter wherein the first stage comprises a series-connected resistor-string segment converter. Switch means are operable by higher-order bits of the digital input signal to step up or down the string of resistors, so as to make connections to the voltage across any selected one of the resistors of the string. As in the above-mentioned Susset U.S. Pat. No. 3,997,892, the voltage across the selected resistor of the string is, in turn, coupled through a pair of buffer amplifiers to the input terminals of the second-stage converter. This latter converter performs an interpolation within the selected voltage from the first stage, in accordance with a set of lower-order bits of the digital input signal.

In accordance with an important aspect of the invention, the roles of the buffer amplifiers are interchanged for each step up (or down) the resistor string of the first stage. This eliminates or minimizes any differential non-linearity errors due to offset mismatch between the buffer amplifiers, thereby making it possible to achieve exceptionally high-resolution performance while employing conventional components and processes.

When the digital input signal requires that the buffer amplifiers be shifted up from across one resistor of the string to the next resistor in the string, the switch system functions in a simple fashion to shift only one connection at a time, in a "leap frog" manner. That is, the connection from one buffer amplifier to one nodal point of the string is shifted to the nodal point next beyond that to which the other buffer amplifier is connected, while the connection of that other buffer amplifier to the resistor string remains unchanged. Thus the connections between the amplifiers and the resistor string are effectively reversed for each step up or down the string, so as to minimize any adverse effects of offset mismatch between the amplifiers.

With such switch sequencing, it will be seen that the voltage between the inputs to the buffer amplifiers reverses polarity with each step up or down the resistor string. In the above-identified copending application Ser. No. 272,053, the correct polarity for the second-stage converter is restored by a reversing switch in the output circuitry of the buffer amplifiers, i.e. in a part of the circuit which is subsequent to the part involved in interchanging the buffer amplifier roles. In the present invention, there is no such reversing switch. Instead, the desired functional result is achieved by reversing the roles of the second-stage converter input terminals in making connections to elements of an R-2R ladder network of that second stage, for each step up or down the resistor string. The end effect is the same as that of a uniform polarity relationship for the input voltage to the second-stage converter for all digital input signals.

DETAILED DESCRIPTION OF A PREFERRED EMBODIMENT

Figure 1:
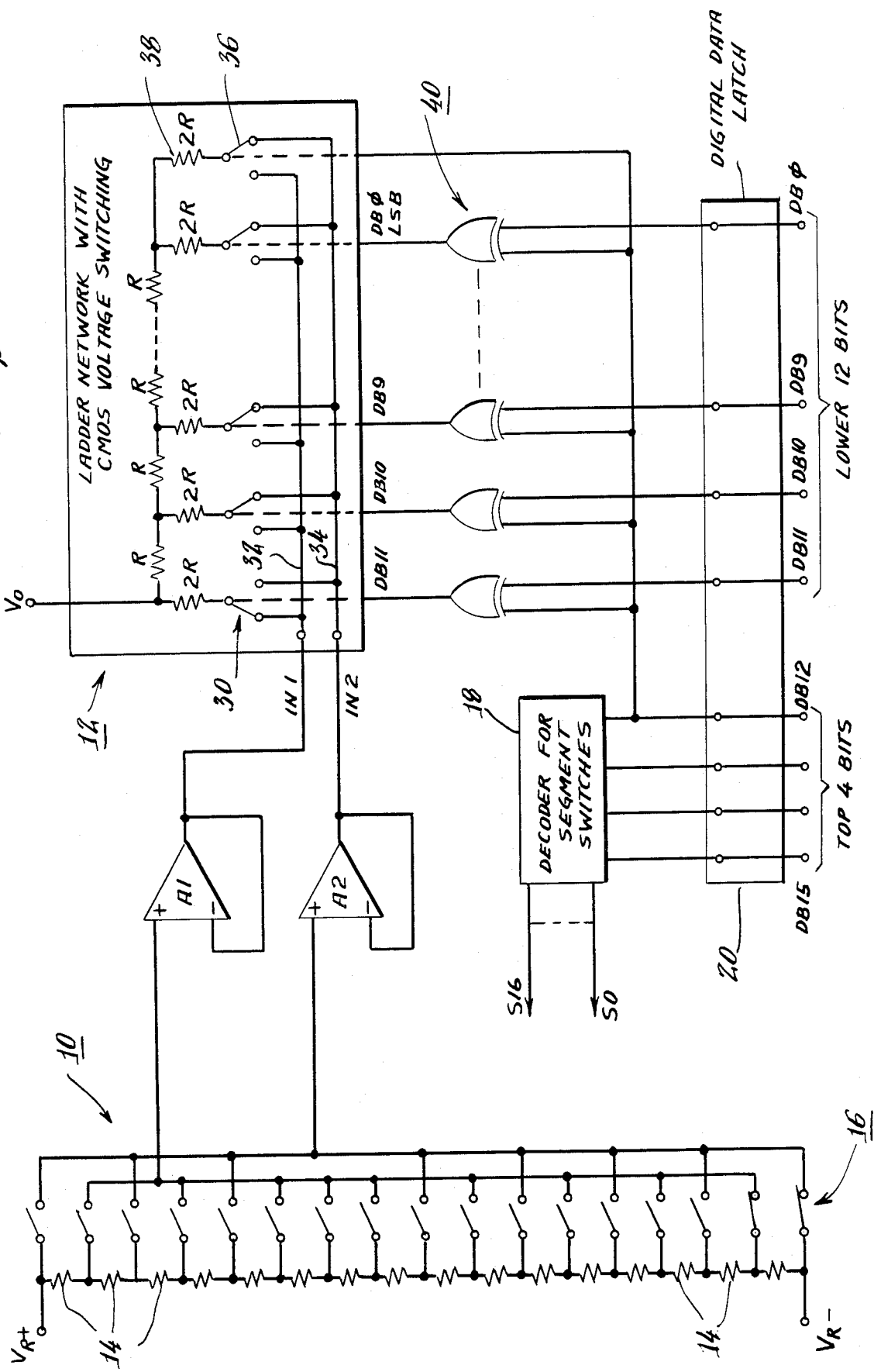
FIG. 1 is a schematic diagram showing a preferred embodiment of the invention.

Referring now to FIG. 1, there is shown a digital-to-analog converter of the cascade type, including a first stage converter 10 and a second stage converter 12. The first stage basically comprises a string of resistors 14, e.g. having equal ohmic resistances for linear conversion, and energized by a reference voltage labelled $V_{R+}$ and $V_{R-}$. A digitally-controlled switch system 16 operates to make selective connection to any adjacent pair of the successive nodal points between the resistors. The switches are operated by control signals represented by arrows S0 through S16 and developed by a segment switch decoder 18 from a set of four higher-order bits of a 16-bit digital input signal applied to a digital data latch 20.

As the higher-order bits change, the switches 16 step the connections to the nodal points up (or down) the string of resistors to connect the voltage across any selected one of the string resistors to a pair of buffer amplifiers A1, A2 driving the input terminals IN1 and IN2 of the second-stage converter 12. This stepping up (or down) the resistor string is effected in a manner such that only one connection is changed for each step.

Figures 2, 3:
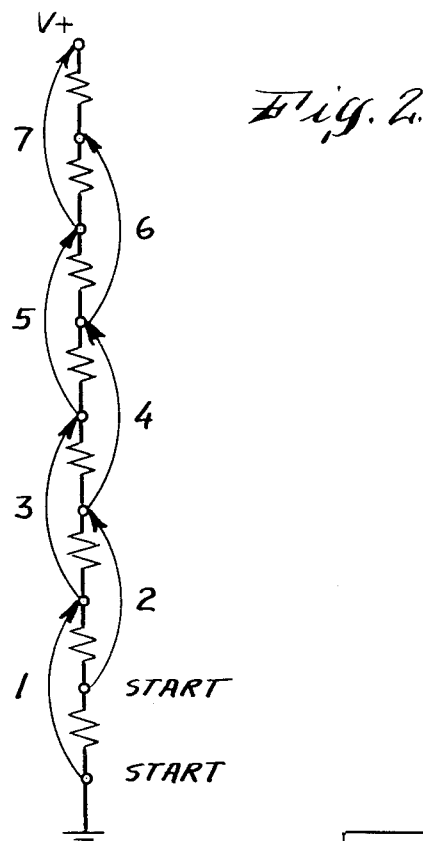
FIG. 2 is a diagram explaining the switching sequences in stepping up (or down) the first-stage resistor string.
FIG. 3 is a truth table for the segment switch decoder of FIG. 1.

FIG. 2 has been included to give a somewhat pictorial presentation of the switching sequences involved in stepping up (or down) the resistor string. It will be seen that, from a "start" position at the bottom of the string, the switching sequence first advances the left-side connection (1), then the right-side connection (2), and so on up the chain. This procedure can be viewed as analogous to the way in which a person walks up stairs, each step taking the trailing leg one step beyond the fore leg. Thus, the procedure can be considered to be "walking up" the resistor string, or as a sequence somewhat akin to "leap frog". A truth table for the segment switches is set forth in FIG. 3.

By following such a switch-stepping procedure in the converter arrangement described, it will be seen that the roles of the buffer amplifiers A1, A2 are interchanged at each step as the switches "walk up" the resistor string. It can be shown mathematically that this interchange of the amplifier roles, in switching from one node to another node two points away, eliminates or significantly minimizes differential non-linearity errors which otherwise could occur due to offset mismatch between the amplifiers.

The second-stage converter 12 comprises a known converter employing a R/2R ladder, with the ladder switches 30 being of CMOS type and operated in the voltage mode. The diagram has been simplified to show only a limited number of the twelve bit switches actually included in the CMOS DAC. The input terminals IN1 and IN2 receive the selected segment voltage from the buffer amplifiers A1, A2 previously described, and deliver corresponding potentials to a pair of supply leads 32, 34. The switches 30 serve to connect the shunt legs of the R/2R ladder to one or the other of the supply leads in accordance with a twelve-bit logic signal applied to the switch terminals. An additional switch 36 is provided to connect the ladder terminating resistor 38 to one or the other of the supply leads in accordance with the binary state of the fourth bit of the 16-bit input signal.

The switch stepping procedure described above causes a reversal of the polarity of the voltage applied to the buffer amplifiers A1, A2 for each step up (or down) the resistor string. In the above-identified copending application Ser. No. 272,053, the effects of this reversal are eliminated by a reversing switch arrangement connected in the output circuits of the buffer amplifiers. In the present embodiment, there is no such reversing switch, and the polarity reversal is dealt with by controlling the set of switches 30 through a corresponding set of Exclusive-OR circuits 40 receiving as one input the binary signal from the fourth data bit, and also by means of the additional switch 36 which similarly is controlled by the fourth data bit. This logic circuitry 40 serves to effect the desired polarity reversal by alternating the connections between the supply leads 32, 34 and the corresponding ladder elements, for each step up or down the string of resistors 14. Each such alternating switchover can perhaps be pictured as turning the resistor network "upside-down" with respect to the supply leads 32, 34. More specifically, the digital control signals applied to the ladder switches 30 are alternatingly changed from a true version of the lower 12-bit signal, to the complement of that 12-bit signal, as the segment switches 16 step up or down the resistor string 14. In synchronism with that operation, the additional switch 36 alternatingly changes the connection to the terminating resistor 38 from one supply lead to the other, such that the resistor always is connected to the supply lead having the lower potential.

The result of this logic-controlled switching is that the correct output signal $V_o$ is automatically produced, regardless of the intercchanging of the roles of the buffer amplifiers A1, A2 as the segment switches 16 are stepped up or down the string of resistors 14.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

What is claimed is:

1. In a two-stage digital-to-analog converter wherein the first stage decodes a set of higher-order bits and the second stage decodes the remaining, lower-order bits, said second stage including an output generating circuit, said first stage comprising a series-connected string of resistors energized, in operation, by a reference voltage and including first switch means responsive to said higher-order bits for stepping up or down the string of resistors to make first and second connections respectively to any pair of adjacent nodal points of said resistor string to produce between first and second reference leads any of the voltages appearing across the resistors of said string;

first and second buffer amplifiers having input circuits connected to said reference leads respectively responsive to the selected nodal point voltages to develop a voltage for the input of said second-stage of the converter;

said first switch means being operable at each step up (or down) the resistor string to interchange the roles of said buffer amplifiers at each step up (or down) the resistor string by switching the connection to only one of said nodal points, connecting the corresponding buffer amplifier to the nodal point next beyond the nodal point to which the other buffer amplifier is connected while leaving said other buffer amplifier with its connection to the resistor string unchanged, whereby said buffer amplifiers are alternatingly connected to the successive nodal points of said resistor string as said first switch means steps the connections up (or down) the string; and means operable to interchange the roles of the buffer amplifiers relative to the output signal generating circuit of said second stage of the converter for each step up (or down) the resistor string effected by said first switch means;

the interchanged roles of said buffer amplifiers produced by said alternating connection of said buffer amplifiers to said successive nodal points serving to minimize differential non-linearity errors which otherwise could occur due to offset mismatch between the buffer amplifiers.

2. In a two-stage digital-to-analog converter wherein the first stage decodes a set of higher-order bits and the second stage decodes the remaining, lower-order bits, said first stage comprising a series-connected string of resistors energized by a reference voltage and including first switch means responsive to said higher-order bits for stepping up or down the string of resistors to make first and second connections respectively to any pair of adjacent nodal points of said resistor string to produce between first and second reference leads any of the voltages appearing across the resistors of said string;

first and second buffer amplifiers having input circuits connected to said reference leads respectively responsive to the selected nodal point voltages to develop a voltage for the input of said second-stage converter;

said first switch means being operable at each step up (or down) the resistor string to interchange the roles of said buffer amplifiers at each step up (or down) the resistor string by switching the connection to only one of said nodal points, connecting the corresponding buffer amplifier to the nodal point next beyond the nodal point to which the other buffer amplifier is connected while leaving said other buffer amplifier with its connection to the resistor string unchanged, whereby said buffer amplifiers are alternatingly connected to the successive nodal points of said resistor string as said first switch means steps the connections up (or down) the string;

means connecting the outputs of said buffer amplifiers to respective input terminals of the second stage of said converter;

an R-2R series/shunt resistor ladder network for said second stage converter;

a set of transistor switches each operable to connect a respective shunt resistor alternatively to one or the other of said input terminals in accordance with the binary state of an applied switch signal;

an additional transistor switch operable to connect said terminating resistor alternatively to one or the other of said input terminals in accordance with the binary state of an applied switch signal;

circuit means for coupling said lower-order bits to said set of transistor switches respectively; 'said circuit means including logic means operable in response to the digital input signal to alternatingly (1) apply the lower-order bits directly to the set of switches, and (2) apply the complement of said bits to the set of switches, for each step (up or down) the resistor string effected by said first switch means; and means operable in synchronism with said first switch means for alternatingly operating said additional transistor switch for each step up (or down) the resistor string effected by said first switch means;

the interchanged roles of said buffer amplifiers produced by said alternating connection of said buffer amplifiers to said successive nodal points serving to minimize differential non-linearity errors which otherwise could occur due to offset mismatch between the buffer amplifiers.

3. Apparatus as claimed in claim 2, wherein said second-stage converter is a CMOS converter employing CMOS voltage switching.

* * * * *

UNITED STATES PATENT AND TRADEMARK OFFICE
CERTIFICATE OF CORRECTION

PATENT NO. : 4,491,825
DATED : January 1, 1985
INVENTOR(S) : Michael G. Tuthill

It is certified that error appears in the above—identified patent and that said Letters Patent is hereby corrected as shown below:

On the title page:

Change the Notice to read:

--The portion of the term of this patent subsequent to July 6, 1999 has been disclaimed.--

Signed and Sealed this

Twenty-eighth Day of May 1985

[SEAL]

Attest:

DONALD J. QUIGG

*Attesting Officer*  *Acting Commissioner of Patents and Trademarks*